US007888745B2

(12) United States Patent
Khater et al.

(10) Patent No.: US 7,888,745 B2
(45) Date of Patent: Feb. 15, 2011

(54) BIPOLAR TRANSISTOR WITH DUAL SHALLOW TRENCH ISOLATION AND LOW BASE RESISTANCE

(75) Inventors: Marwan H. Khater, Astoria, NY (US); Andreas D. Stricker, Essex Junction, VT (US); Bradley A. Orner, Fairfax, VT (US); Mattias E. Dahlstrom, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 11/425,550

(22) Filed: Jun. 21, 2006

(65) Prior Publication Data
US 2007/0298578 A1 Dec. 27, 2007

(51) Int. Cl.
*H01L 29/72* (2006.01)
(52) U.S. Cl. .................. 257/370; 257/371; 257/374
(58) Field of Classification Search ................. 257/370, 257/371, 377, 378, 374, 376
See application file for complete search history.

(56) References Cited

U.S. PATENT DOCUMENTS

| | | | | |
|---|---|---|---|---|
| 5,024,957 | A * | 6/1991 | Harame et al. .............. | 438/367 |
| 5,128,271 | A | 7/1992 | Bronner et al. | |
| 5,599,723 | A | 2/1997 | Sato | |
| 6,060,365 | A * | 5/2000 | Kim ........................... | 438/357 |
| 6,228,733 | B1 * | 5/2001 | Lee et al. .................... | 438/363 |
| 6,399,993 | B1 * | 6/2002 | Ohnishi et al. .............. | 257/370 |
| 6,406,975 | B1 * | 6/2002 | Lim et al. ................... | 438/421 |
| 6,656,811 | B2 * | 12/2003 | Swanson et al. ............ | 438/320 |
| 6,674,149 | B2 * | 1/2004 | Ohnishi et al. .............. | 257/591 |
| 6,858,532 | B2 * | 2/2005 | Natzle et al. ................ | 438/637 |
| 6,861,324 | B2 * | 3/2005 | Kalnitsky et al. ........... | 438/320 |
| 6,864,560 | B2 | 3/2005 | Khater et al. | |
| 6,888,221 | B1 | 5/2005 | Joseph et al. | |
| 6,894,354 | B2 * | 5/2005 | Jono et al. .................. | 257/374 |
| 6,936,519 | B2 * | 8/2005 | Verma et al. ................ | 438/309 |

(Continued)

OTHER PUBLICATIONS

Heinemann, B. et al. "A Low-Parasitic Collector Construction for High-Speed SiGe:C HBTs," IEEE (2004).

*Primary Examiner*—Steven Loke
*Assistant Examiner*—David Goodwin
(74) *Attorney, Agent, or Firm*—Scully, Scott, Murphy & Presser, P.C.; H. Daniel Schnurmann

(57) ABSTRACT

An improved bipolar transistor with dual shallow trench isolation for reducing the parasitic component of the base to collector capacitance Ccb and base resistance Rb is provided. The structure includes a semiconductor substrate having at least a pair of neighboring first shallow trench isolation (STI) regions disposed therein. The pair of neighboring first STI regions defines an active area in the substrate. The structure also includes a collector disposed in the in the active area of the semiconductor substrate, a base layer disposed atop a surface of the semiconductor substrate in the active area, and a raised extrinsic base disposed on the base layer. In accordance with the present, the raised extrinsic base has an opening to a portion of the base layer. An emitter is located in the opening and extending on a portion of the patterned raised extrinsic base; the emitter is spaced apart and isolated from the raised extrinsic base. Moreover, and in addition to the first STI region, a second shallow trench isolation (STI) region is present in the semiconductor substrate which extends inward from each pair of said first shallow trench isolation regions towards said collector. The second STI region has an inner sidewall surface that is sloped. In some embodiments, the base is completely monocrystalline.

22 Claims, 13 Drawing Sheets

U.S. PATENT DOCUMENTS

| | | | |
|---|---|---|---|
| 6,972,443 B2 * | 12/2005 | Khater | 257/197 |
| 7,102,205 B2 * | 9/2006 | Chidambarrao et al. | 257/592 |
| 2002/0158311 A1 * | 10/2002 | Ohnishi et al. | 257/591 |
| 2003/0119249 A1 * | 6/2003 | Swanson et al. | 438/234 |
| 2005/0151165 A1 * | 7/2005 | Chan et al. | 257/198 |
| 2005/0233535 A1 * | 10/2005 | Freeman et al. | 438/349 |
| 2006/0071239 A1 * | 4/2006 | Saito et al. | 257/192 |
| 2007/0023864 A1 * | 2/2007 | Khater | 257/565 |

* cited by examiner

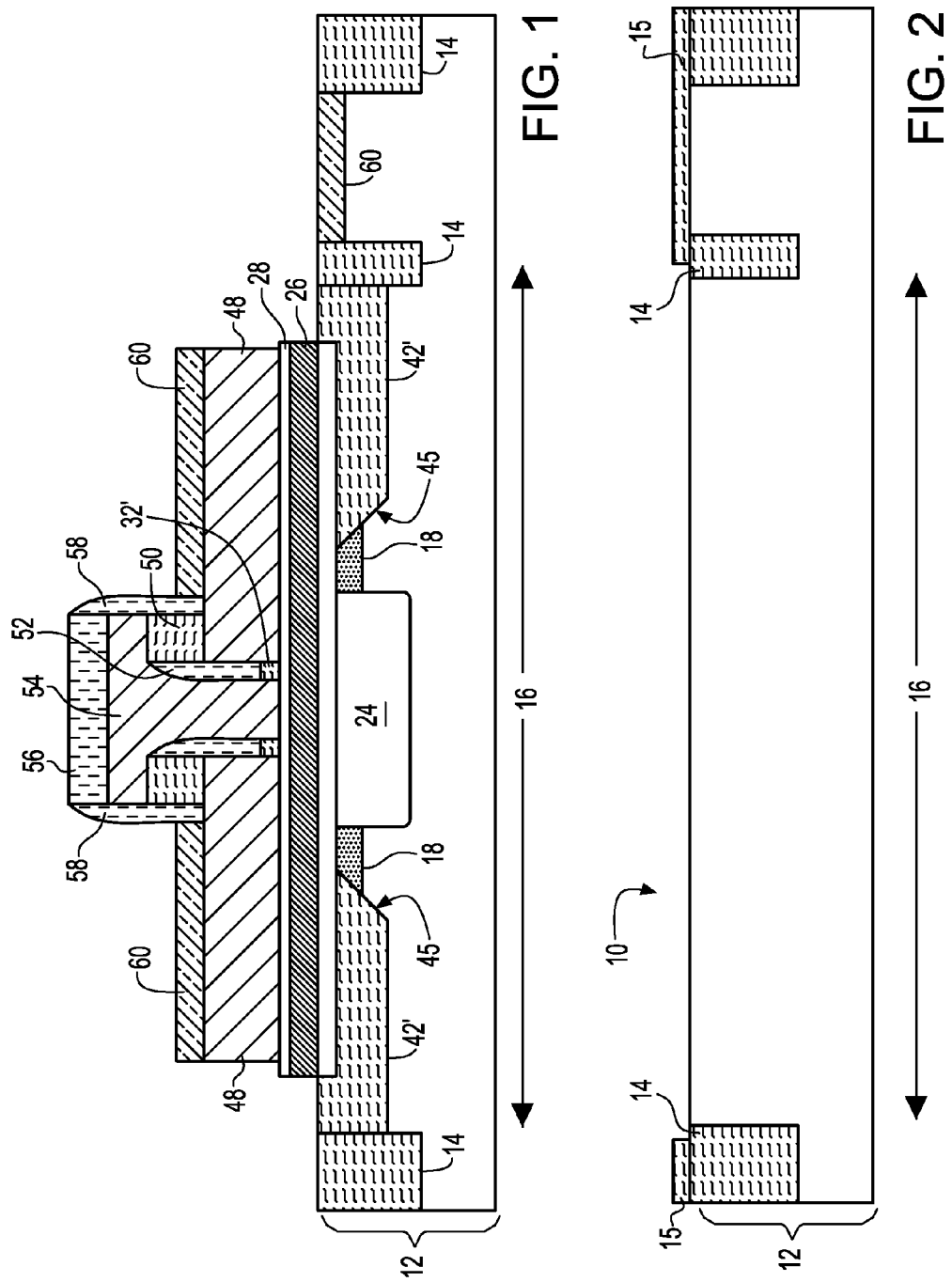

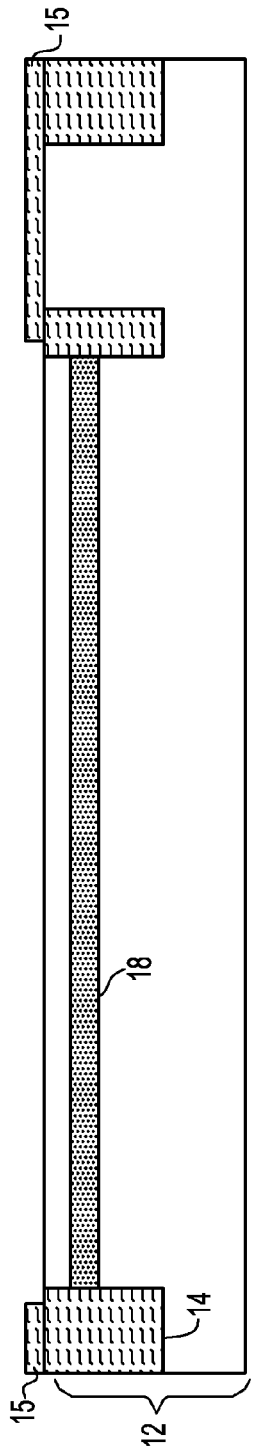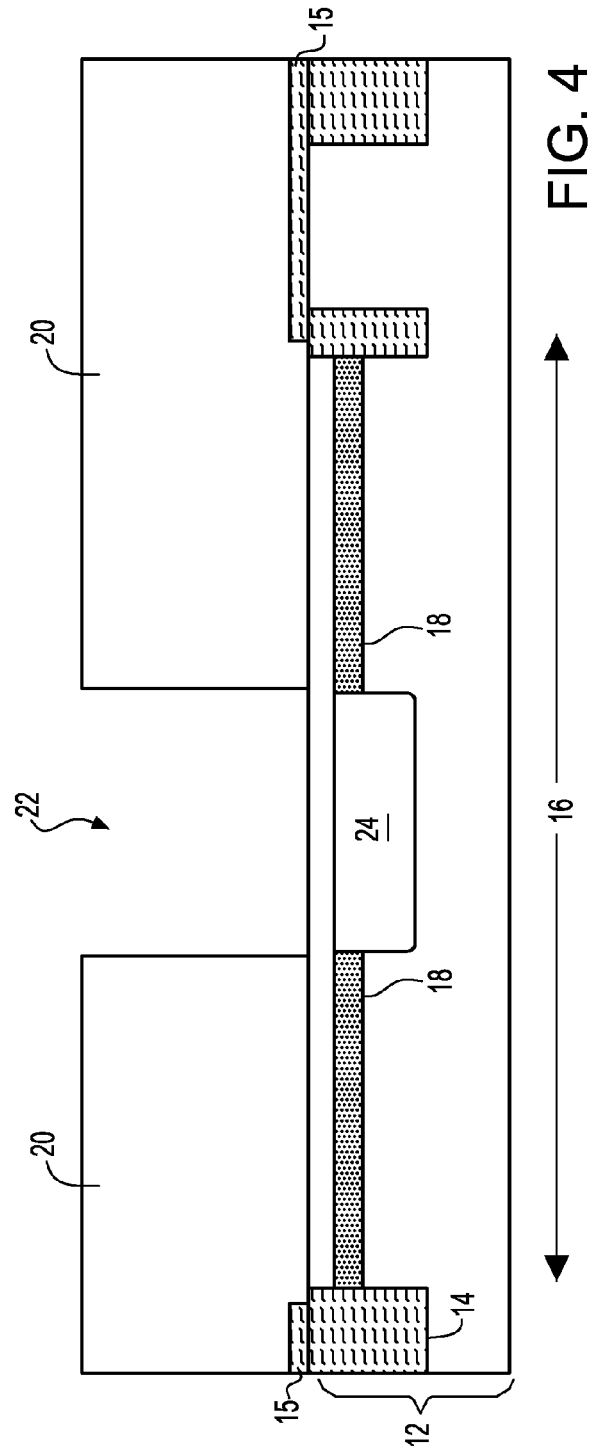

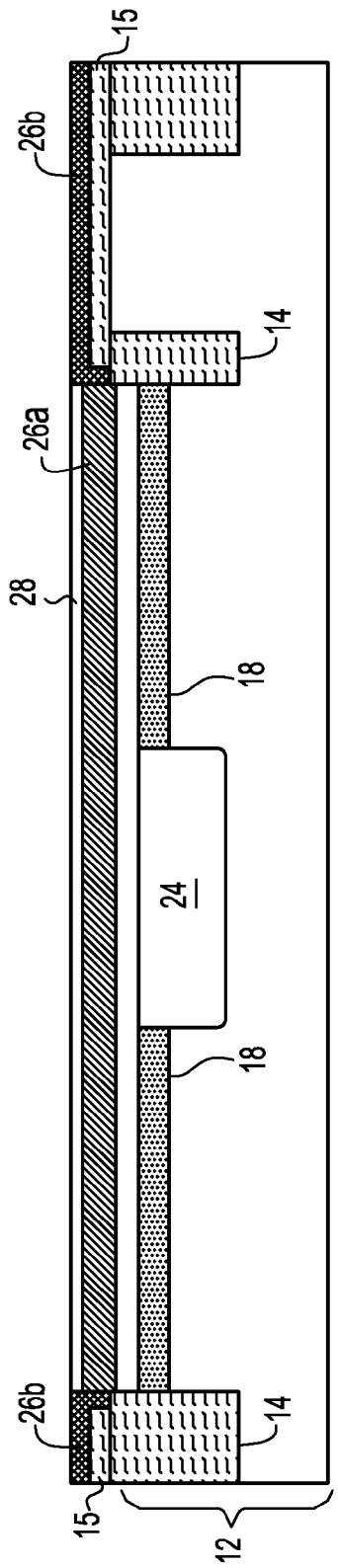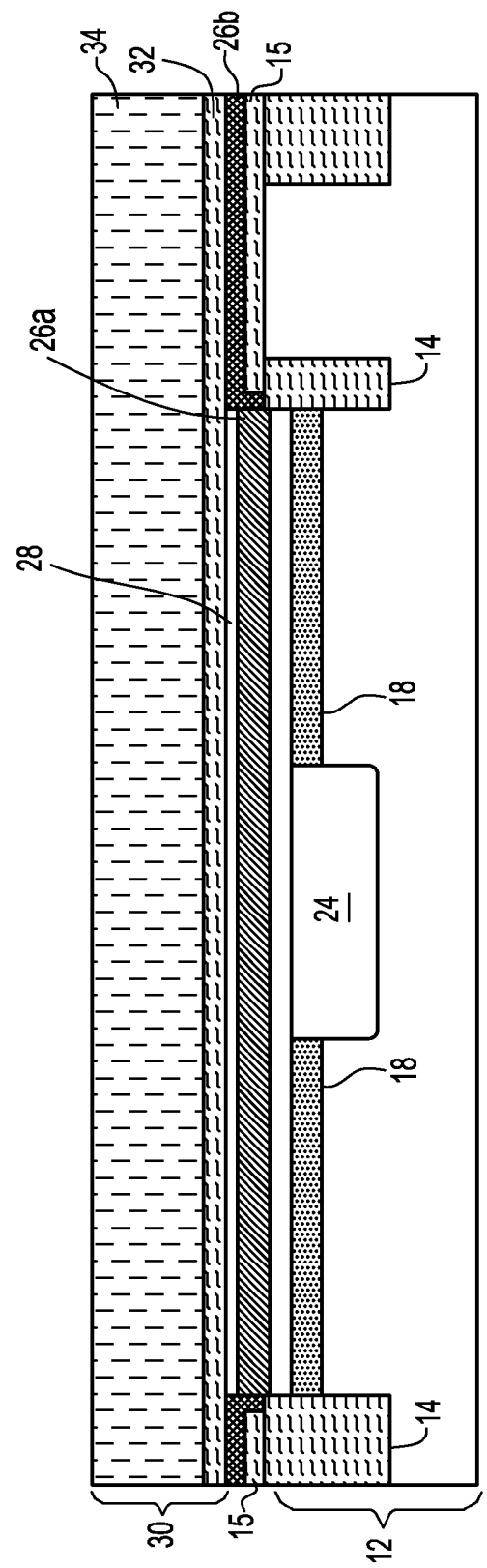

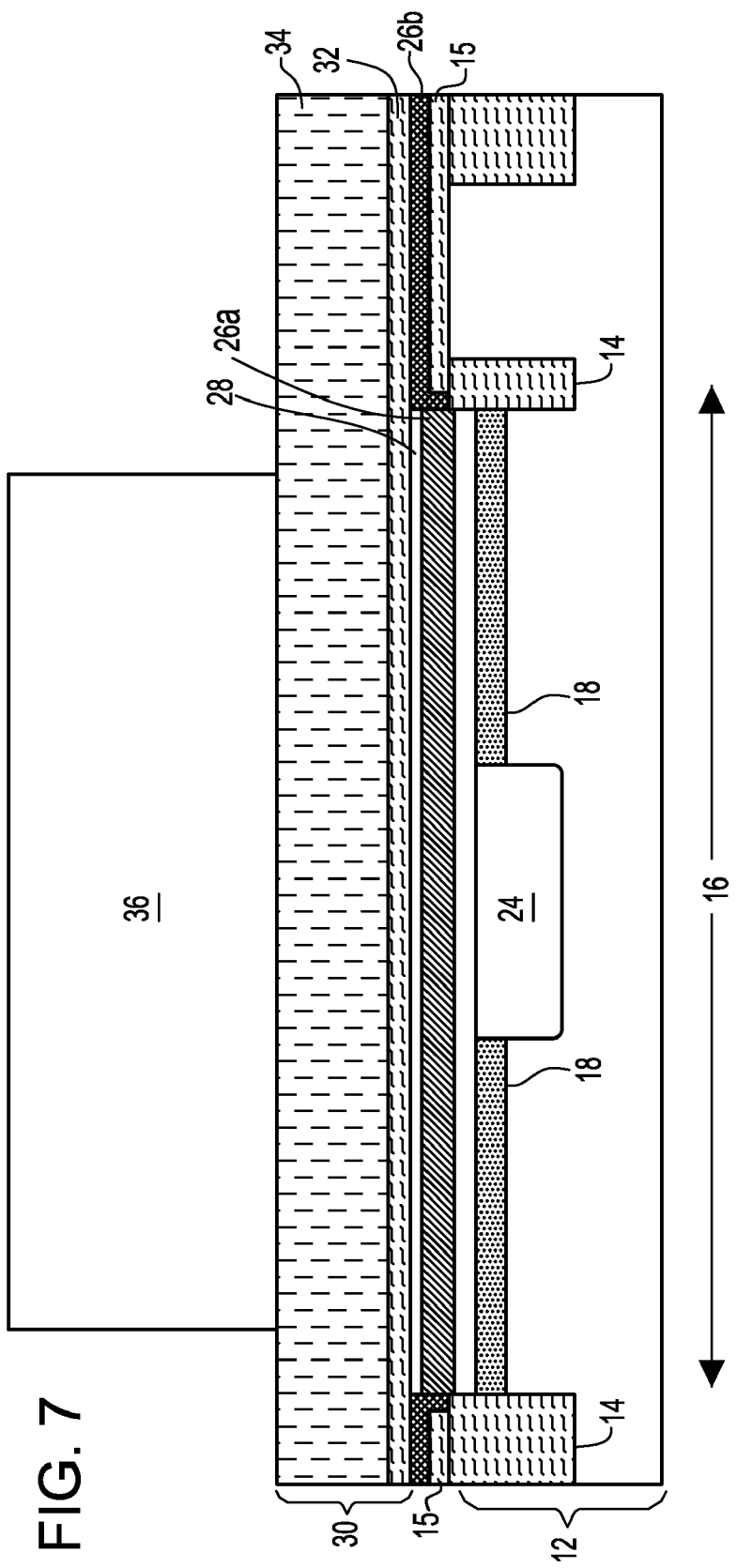

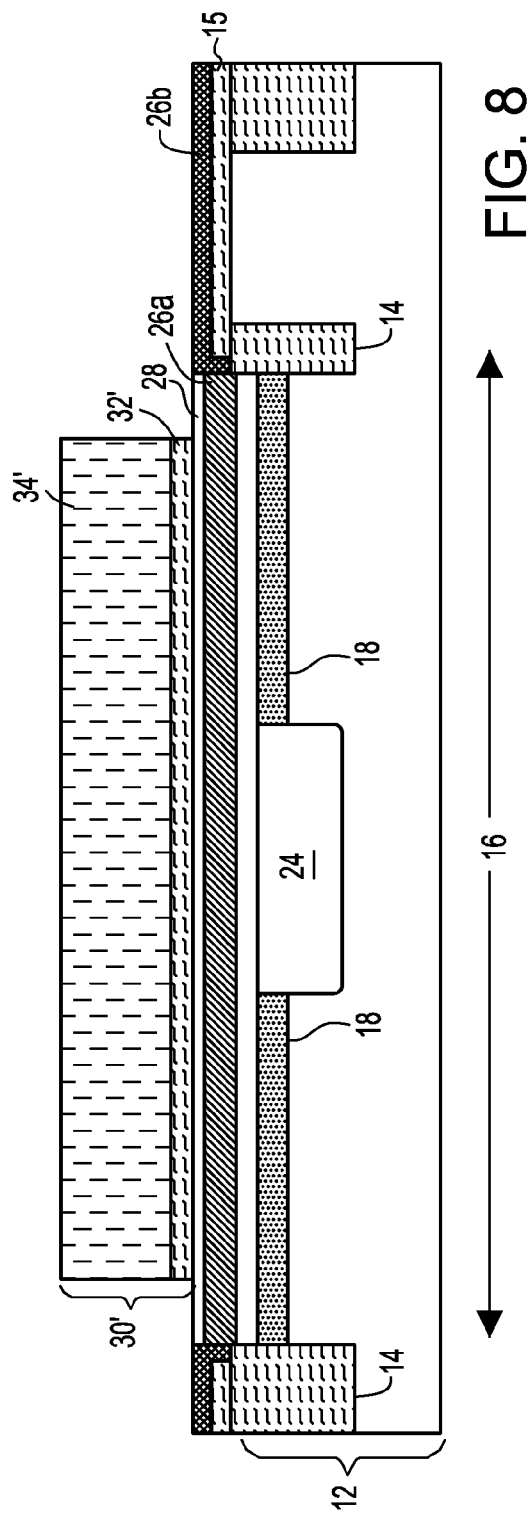
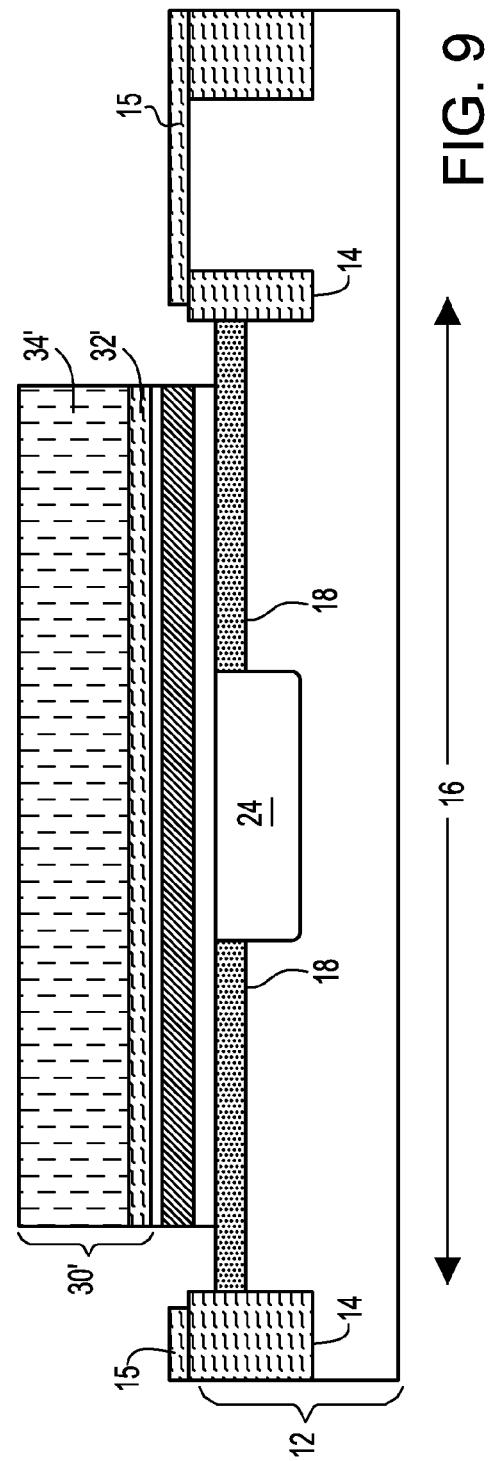
FIG. 8
FIG. 9

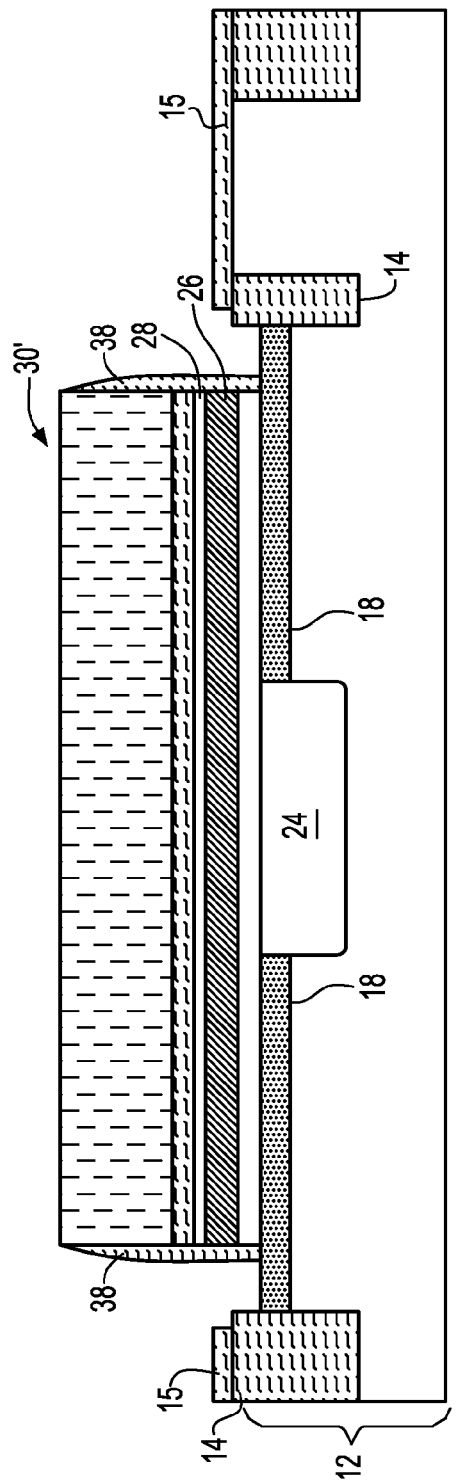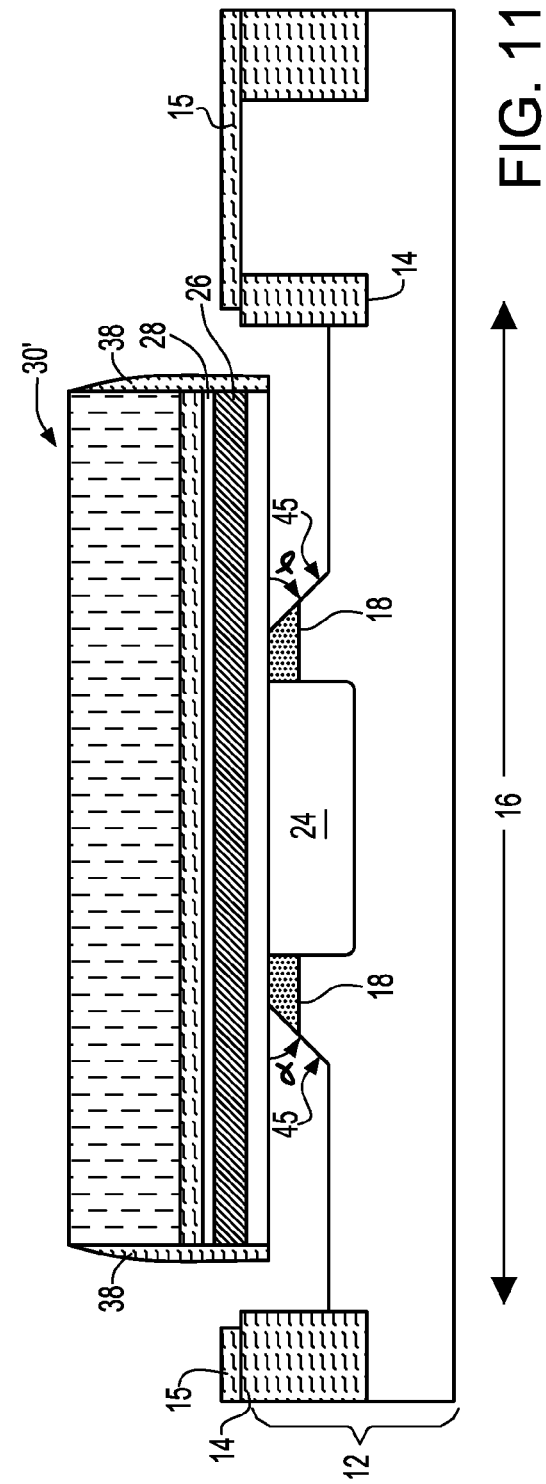

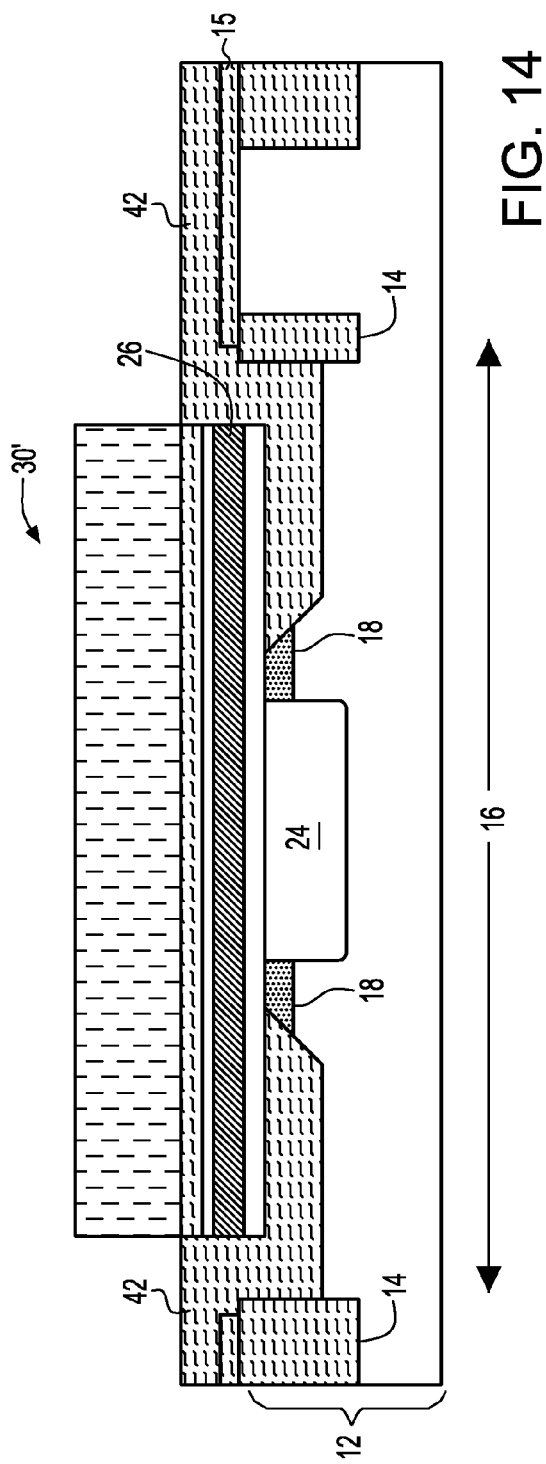
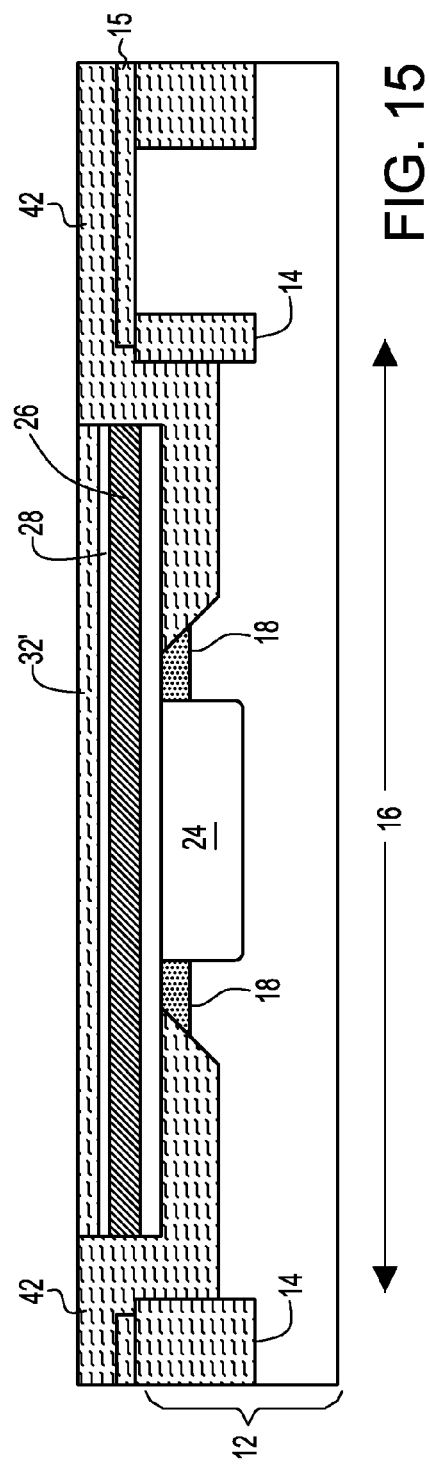
FIG. 14
FIG. 15

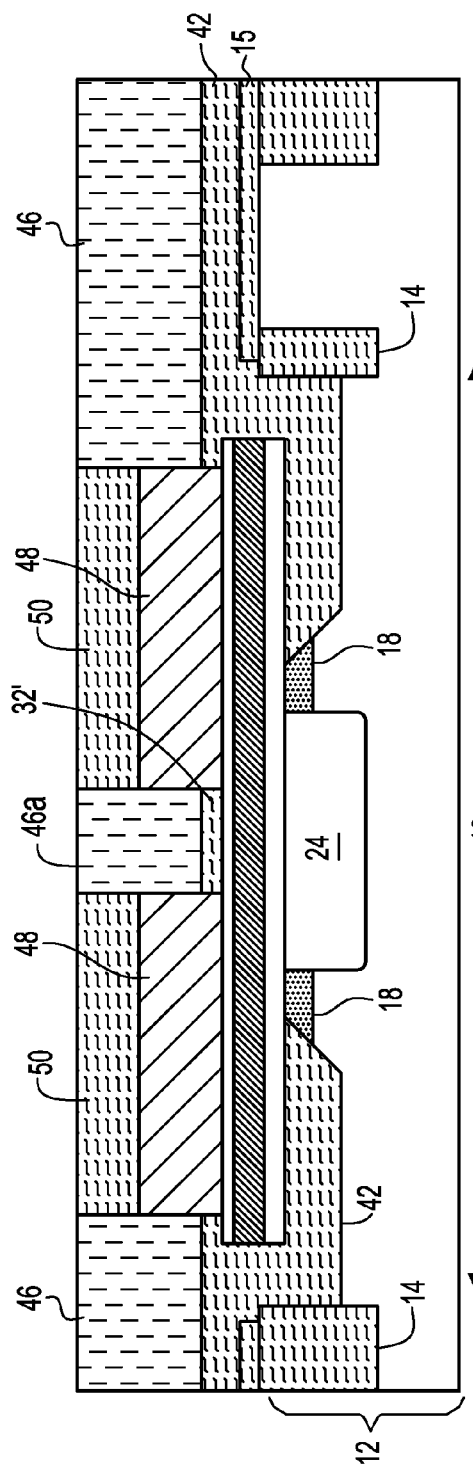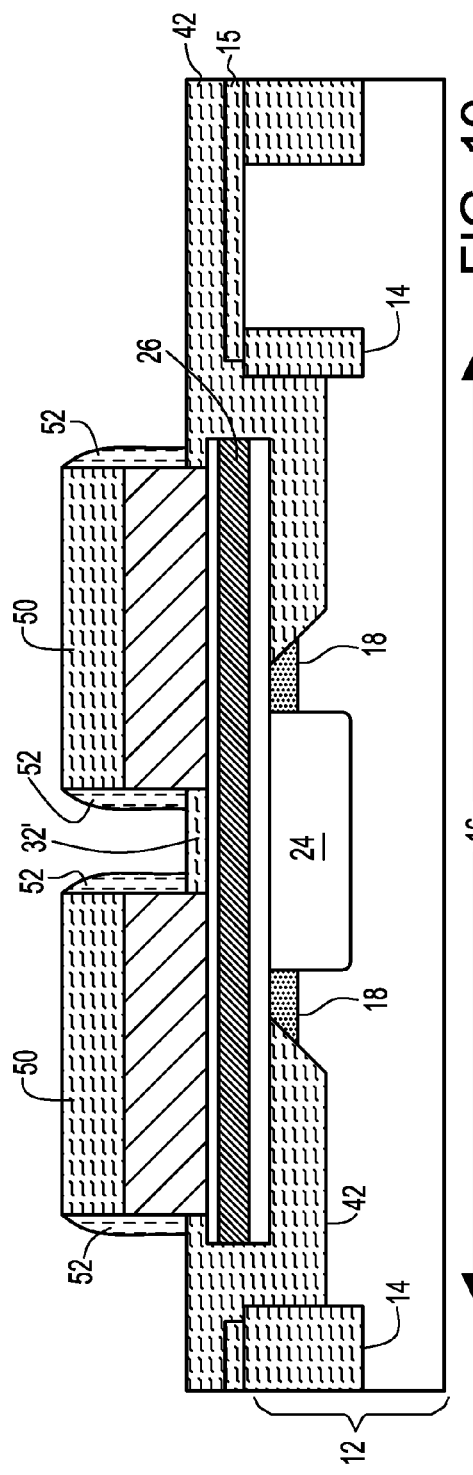

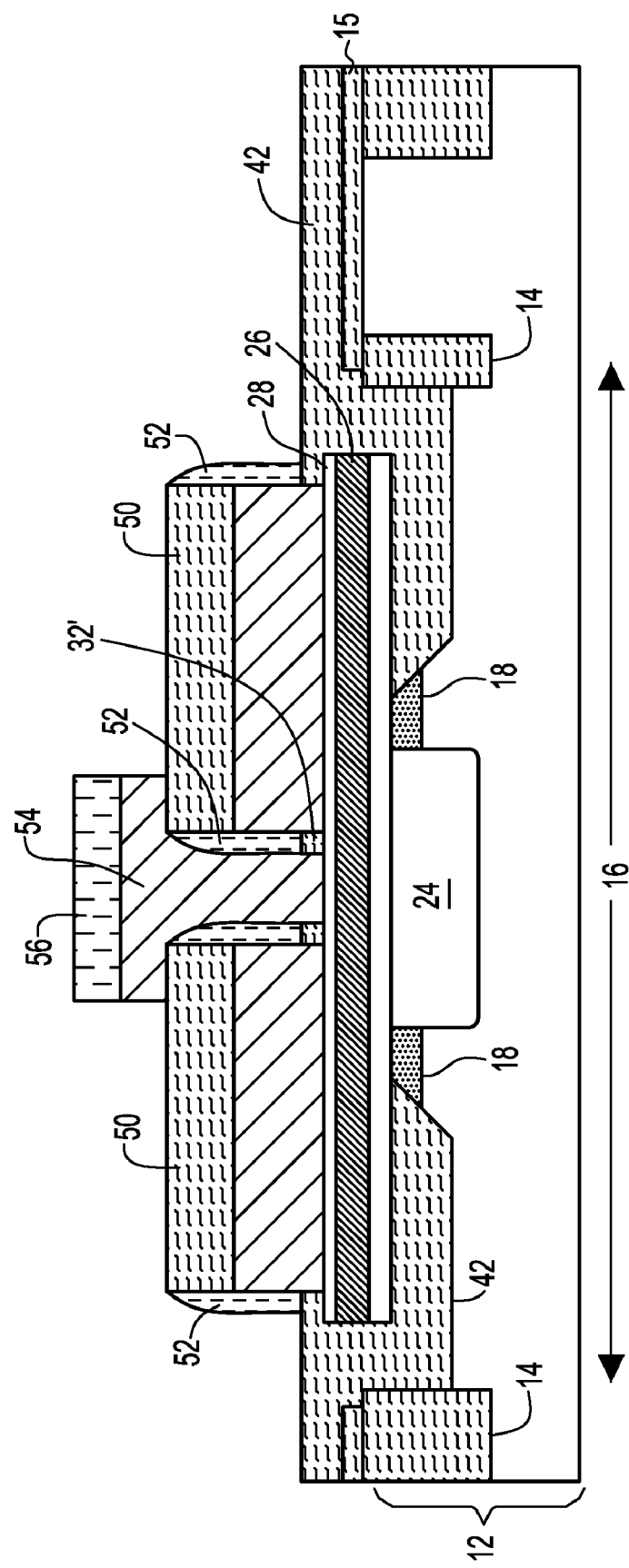

BIPOLAR TRANSISTOR WITH DUAL SHALLOW TRENCH ISOLATION AND LOW BASE RESISTANCE

FIELD OF THE INVENTION

The present invention relates to a semiconductor device structure and more particularly to a bipolar transistor in which the parasitic component of the base to collector capacitance (Ccb) and base resistance (Rb) are significantly reduced to improve the transistor performance. In accordance with the present invention, a dual trench isolation scheme is used that reduces the parasitic component of Ccb and Rb. In some embodiments of the present invention, the dual trench isolation scheme also allows the raised extrinsic base to be completely monocrystalline.

BACKGROUND OF THE INVENTION

Bipolar transistors are devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

Cut-off frequency (fT) and maximum oscillation frequency (fmax) are the most representative measures of operation speed for high-speed transistors. Hence, design and optimization efforts for high-speed transistors are mostly directed toward optimization of these two parameters. One of the device parameters that influences fT and fmax is the base to collector capacitance (Ccb). As is known to those skilled in the art, Ccb contributes to fT as a form of RC delays associated with emitter and collector resistance and transconductance. The base to collector capacitance contribution to fmax dominates over those from any other parameter since its effect on fmax are two-folded: one directly affects fmax, while the other comes indirectly from fT. Another device parameter that influences fmax is the base resistance Rb. The raised extrinsic base region in modern bipolar transistor is composed mostly of polycrystalline silicon, which has lower mobility compared to crystalline silicon. For such device structure, Rb is limited by the lower charge carrier mobility in polycrystalline silicon.

More than two-thirds of the total Ccb comes from the extrinsic portion, or parasitic capacitance. This parasitic capacitance results from the overlap between the collector and base (intrinsic and extrinsic) regions outside the active transistor area and enclosed by a shallow trench isolation (STI). The overlap between these regions can not be minimized by lithography due to limitation of overlay and alignment tolerances. Moreover, the capacitance is further increased by the transport enhanced diffusion of the dopants from the base region to the collector region. Therefore, structural optimization of the device that reduces the parasitic component is a key factor for the improvement of fT and fmax (i.e., the operational speed of the device). In addition, Rb is limited by the extrinsic base resistance, which is mostly composed of polycrystalline silicon. The major charge carrier mobility in polycrystalline silicon is considerably lower than in crystalline silicon.

U.S. Pat. No. 5,599,723 to Sato entitled "Method for Manufacturing Bipolar Transistor Having Reduced Base-Collector Parasitic Capacitance" discloses the use of SiGe for the base, and that the parasitic capacitance formed between the collector epitaxial layer and the base electrode single crystal silicon film is reduced because the distance between them is set to about 1000 Å. In order to reduce the parasitic capacitance by the prior art technique, the intrinsic base must be thickened, and thus the cut-off frequency fT is lowered. A single crystal form of silicon formed by the selective epitaxial growth is used for the base electrode to reduce the parasitic capacitance between the base and the collector, particularly by forming the base of SiGe. The entire device including the collector region is formed above the surface of the silicon semiconductor substrate. This approach to reducing the parasitic capacitance is to use selective epitaxy to grow the intrinsic base.

U.S. Pat. No. 5,128,271 to Bronner et al. entitled "High Performance Vertical Bipolar Transistor Structure via Self-aligning Processing Techniques" describes a self-aligned, vertical bipolar transistor structure and a method of manufacturing such a structure with "reduced parasitic base collector capacitance" achieved by providing correct alignment. The Bronner et al. approach has similarities with the present approach to solution of the parasitic base collector capacitance problem. However, the approach of this invention has significant features not described in the Bronner et al. patent. For example, the present invention decouples the primary shallow trench isolation formation from the secondary shallow isolation formation to reduce the parasitics. This major difference allows a robust manufacturing process and flexible device performance.

U.S. Pat. No. 6,864,560 to Khater et al. entitled "Bipolar Transistor Structure With a Shallow Isolation Extension Region Providing Reduced Parasitic Capacitance" discloses a structural modification to a bipolar transistor that reduces the parasitic component of Ccb. More specifically, Khater et al. discloses partially removing the excess overlap region between the collector and the base and filling that same with a dielectric prior to forming the extrinsic base region. The dielectric separates the collector from the extrinsic base and acts as a barrier for dopant diffusion to reduce the parasitic component of Ccb. Although Khater et al. discloses the use of a dual shallow trench isolation scheme, the present invention improves upon the previous technology by providing a second shallow trench isolation that has sloped sidewalls positioned adjacent the collector region. The sloped sidewalls of the second trench isolation region of the present invention gives maximum Ccb close to the junction, but keeps the collector region sufficiently wide such that the collector resistance is kept low.

Moreover, the present invention provides an extended secondary shallow trench isolation that overlaps the whole raised extrinsic base region, which allows, in some embodiments of the present invention, the raised extrinsic base region to be completely composed of monocrystalline silicon. In this case, Rb is reduced due to a higher mobility in the crystalline raised extrinsic base. Furthermore, the mobility in the base can be further improved by a stress layer.

In view of the above, there is a need for providing a bipolar transistor wherein structural modifications have been introduced which reduces the parasitic component of Ccb and Rb with minimum adverse effect on other parameters. The parasitic component of Ccb in typical silicon based bipolar transistors is the result of the existence of a depletion region of the base-collector p-n junction formed at the extrinsic part of the device. In accordance with the present invention, the parasitic capacitance is reduced by employing materials with reduced dielectric constants in the depletion region, since silicon has a high dielectric constant.

SUMMARY OF THE INVENTION

The present invention provides a bipolar transistor which overcomes the drawbacks mentioned above with respect to prior art bipolar transistor structures. More particularly, the present invention provides a bipolar transistor which has been modified to reduce the parasitic component of Ccb and Rb with minimum effect on other bipolar transistor parameters. More specifically, the present invention provides a bipolar transistor with a dual shallow trench isolation scheme and optionally, a monocrystalline silicon raised extrinsic base with a stress layer.

In accordance with the present invention, the dual shallow trench isolation scheme reduces the parasitic component of Ccb to values which are lower than those associated with prior art bipolar transistors.

In general terms, the present invention provides a semiconductor structure comprising:

a semiconductor substrate having at least a pair of neighboring first shallow trench isolation (STI) regions disposed therein, said pair of neighboring first STI regions defining an active area in said substrate;

a collector disposed in a buried region in said active region of said substrate, said buried region having a graded profile of dopants;

a base layer disposed atop a surface of said semiconductor substrate in said active area;

a raised extrinsic base disposed on said base layer, said raised extrinsic base having an opening to a portion of said base layer;

an emitter located in said opening and extending over a portion of said raised extrinsic base, said emitter is spaced apart and isolated from the raised extrinsic base; and a second shallow trench isolation (STI) region in said semiconductor substrate extending inward from each pair of said first shallow trench isolation regions towards said collector, wherein said second STI region has an inner sidewall surface in proximity to the collector that is sloped and wherein an upper portion of the semiconductor substrate remains beneath the base layer.

In accordance with the present invention, the raised extrinsic base may be comprised of a polycrystalline semiconductor material or a monocrystalline (or crystalline) semiconductor material. In embodiments where the raised extrinsic base is comprised of a crystalline semiconductor material, a stressed liner (compressive or tensile) can be formed over the bipolar transistor to strain the raised extrinsic base and improve the mobility of carriers in the raised extrinsic base layer.

In addition to providing a semiconductor structure including a bipolar transistor with a dual shallow trench isolation scheme, the present invention also provides a method of fabricating such a semiconductor structure. In general terms, the method of the present application comprises:

providing a semiconductor substrate having at least a pair of neighboring first shallow trench isolation (STI) regions disposed therein, said pair of neighboring first STI regions defining an active area in said substrate;

forming a buried region having a graded profile of dopants in said active area of said semiconductor substrate;

forming a collector in said active area of said semiconductor substrate including said buried region;

forming a base layer atop a surface of said semiconductor substrate in said active area;

forming an undercut in said semiconductor substrate extending inward from each pair of said first shallow trench isolation regions towards said collector, wherein said undercut has an inner sidewall surface spaced in proximity to said collector that is sloped;

forming an oxide at least partially within said undercut;

forming a raised extrinsic base on said base layer, said raised extrinsic base having an opening to a portion of said base layer;

forming an emitter in said opening and extending over a portion of said raised extrinsic base, said emitter is spaced apart and isolated from the raised extrinsic base; and stripping said oxide which extends above said semiconductor substrate while leaving said oxide at least partially in said undercut thereby forming a second shallow trench isolation which extends inward from each pair of first STI regions towards said collector.

BRIEF DESCRIPTION OF THE DRAWINGS

FIG. 1 is a pictorial representation (through a cross sectional view) depicting the inventive semiconductor structure including a bipolar transistor with a dual shallow trench isolation scheme.

FIGS. 2-21 are pictorial representations (through cross sectional views) depicting the basic processing steps used in the present application for forming the semiconductor structure shown in FIG. 1.

DETAILED DISCUSSION OF THE INVENTION

Figure 12:
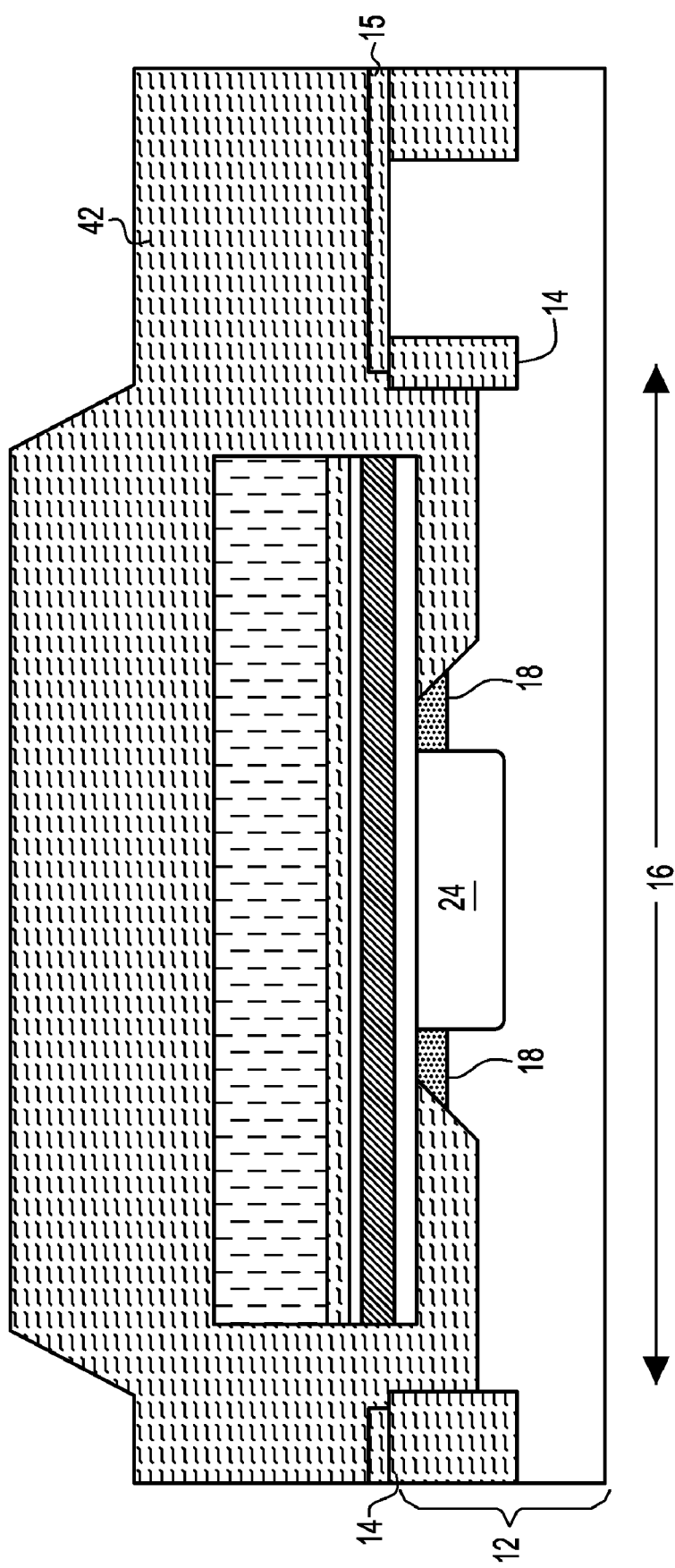

The present invention, which provides a bipolar transistor with dual shallow trench isolation and a method of fabricating the same, will now be described in greater detail by referring to the following discussion and drawings that accompany the present application. It is noted that the drawings are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides improved bipolar transistors with dual shallow trench isolation for reducing the parasitic component of the base to collector capacitance Ccb. The use of such a dual shallow trench isolation scheme improves fT and fmax with minimum effects on the other bipolar transistor parameters. That is, the use of the dual shallow trench isolation configuration improves the operational speed of the device.

FIG. 1 is a pictorial representation (through a cross sectional view) illustrating the semiconductor structure of the present application.

The structure illustrated in FIG. 1 includes a semiconductor substrate 12 having at least a pair of neighboring first shallow trench isolation (STI) regions 14 disposed therein. The pair of neighboring first STI regions 14 defines an active area 16 in the substrate 12. The structure shown in FIG. 1 also includes a collector 24 disposed in the active area 16 of the semiconductor substrate 12, a base layer 26 disposed atop a surface of the semiconductor substrate 12 in the active area 16, and a raised extrinsic base 48 disposed on the base layer 26. It is noted that the collector 24 is located within a buried region 18 that has a graded profile of dopants. In accordance with the present invention and as shown in FIG. 1, the raised extrinsic base 48 has an opening to a portion of the base layer 26. The raised extrinsic base can be comprised of a polycrystalline semiconductor material, or a crystalline semiconductor material. An emitter 54 is located in the opening and extending over a portion of the raised extrinsic base 48. As is shown, the emitter 54 is spaced apart and isolated from the raised extrinsic base 54.

Moreover, and in addition to the first STI regions, a second shallow trench isolation (STI) region 42' is present in the semiconductor substrate 12 which extends inward from each pair of the first shallow trench isolation regions 16 towards the collector 24. The second STI region 42' has an inner sidewall surface 45 that is sloped.

In accordance with the present invention, and as shown in FIG. 1 the second STI region 42' is located beneath the base layer 26, with a semiconducting layer, i.e., an upper part of the substrate 12, located there between. Moreover, and as shown in FIG. 1, the second STI region 42' is located under the whole area of the raised extrinsic base 48.

The other elements of the bipolar transistor structure not specifically mentioned above, yet labeled in FIG. 1 will be explained in greater detail herein below in referring to the process description of the present application.

Reference is now made to FIGS. 2-21 which are pictorial representations (through cross sectional views) illustrating the basic processing steps of the present invention that are used in forming the structure shown in FIG. 1.

FIG. 2 shows an initial structure 10 including a semiconductor substrate 12 having first shallow trench isolation regions 14 formed therein as well as a patterned hard mask 15 which is located on areas of the substrate 12 in which a bipolar transistor is not to be formed. That is, the patterned hard mask 15 protects portions of the substrate 12 in which the bipolar transistor is not to be formed, while leaving an active area 16 of substrate 12 exposed. The active area 16 is the area of substrate 12 between a pair of neighboring first shallow trench isolation regions 14 in which the bipolar transistor will be formed.

The semiconductor substrate 12 of the initial structure 10 comprises any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) are also contemplated herein. Typically, the semiconductor substrate 12 is a Si-containing semiconductor such as, for example, Si, SiC, SiGe, SiGeC, or a silicon-on-insulator. The semiconductor substrate 12 may be unstrained, strained or include regions of strain and unstrain therein. The semiconductor substrate 12 may be intrinsic or it may be doped with, for example, but not limited to: B, As or P.

The first shallow trench isolation regions 14 are formed into the substrate 12 utilizing techniques that are well known to those skilled in the art. For example, the first shallow trench isolations may be formed by lithography, etching, optionally forming a trench liner, trench filling and planarization. The trench fill includes a dielectric material such as a high-density oxide or an oxide derived from a precursor such as tetraethylothosilicate (TEOS). The term "shallow" is used throughout the present invention to denote that the depth of the trench used in forming the shallow trench isolation region, as measured from the upper surface of the substrate, is about 0.3 μm or less, with a trench depth of about 250-350 nm or less being more typical.

After processing the semiconductor substrate 12, a blanket layer of a hard mask material such as an oxide, oxynitride, nitride or multilayers thereof is formed on the surface of the substrate 12 and the first shallow trench isolation regions 14 utilizing a conventional deposition process. Illustratively, the blanket layer of hard mask material may be formed by chemical vapor deposition (CVD), plasma-enhanced chemical vapor deposition (PECVD), atomic layer deposition (ALD), evaporation, physical vapor deposition (PVD), and other like deposition processes. Typically, the hard mask material is an oxide.

After depositing a blanket layer of hard mask material on the substrate 12 and the first shallow trench isolation region 14, the hard mask material is patterned by lithography and etching to open the active area 16 of the substrate 12 in which the bipolar transistor will be subsequently formed. In this step of the present invention, the patterned hard mask 15 described above is formed. The lithographic step includes applying a photoresist (not shown) to the surface of the hard mask material, exposing the photoresist to a desired pattern of radiation and developing the exposed resist utilizing a conventional resist developer. The etching step includes any dry etching process such as reactive-ion etching, ion beam etching, plasma etching or laser ablation. Although a dry etching process is typically used, a chemical wet etching process is also contemplated for etching the hard mask material. After etching, the resist is stripped providing the initial structure 10 shown in FIG. 2.

It is noted that dimension, i.e., width, of the active area 16 is the same as that of the final extrinsic base to be subsequently formed. Typically, the width of the active area 16 is from about 750 to about 1500 nm, with a width of 1000 nm being even more typical.

FIG. 3 shows the structure that is formed after a buried region 18 is formed in the active areas 16 of the semiconductor substrate 12. The buried region 18 is formed in the active area 16 of the substrate 12 in which the collector will be subsequently formed. In accordance with the present invention, the buried region 18 has a graded dopant profile, which is used to control the final slope of the sidewall of the second shallow trench isolation. In particular, the graded profile is such that the etch rate at the top of the buried region 18 is faster than at the bottom of the buried region 18. This is achieved by wet etch with etch rate that varies with dopant concentration and is very selective to the material of substrate 12. The buried region 18 includes one of Ge, P and As and those dopants are present in the buried region 18 in a concentration that varies within ranges that are well-known to those skilled in the art.

The buried region 18 can be formed by ion implantation or by using in-situ doping during collector epitaxial growth. The condition of the ion implantation and in-situ doping are selected so as to form a buried region 18 having a graded dopant profile.

Next, a patterned photoresist 20 is formed on the structure shown in FIG. 3 utilizing conventional lithography as described above. As is illustrated in FIG. 4, the patterned photoresist 20 has an opening 22 exposing a portion of the active area 16 of substrate 12 including the buried region 18. A collector selective implant (SIC) 24 is then formed into the semiconductor substrate 12 by selective ion implantation utilizing the patterned photoresist as an ion implantation mask. Typically, the collector 24 includes P or As which is implanted into the semiconductor substrate 12 during this step of the present invention.

After forming the collector 24, the patterned photoresist 20 is stripped utilizing a conventional resist stripping process well known to those skilled in the art. At this point of the present invention, a low temperature (on the order of about 450° to about 700° C.) epitaxial growth process is used to form a base layer 26 on the exposed surfaces of the substrate 12 and atop the first shallow trench isolation regions 14. An optional base cap 28 may be disposed atop the base layer 26. The resultant structure including the base layer 26 and the optional base cap 28 is shown, for example, in FIG. 5.

The base layer 26, which may comprise Si, SiGe or a combination of Si and SiGe, is monocrystalline 26a on top of the exposed surface of the semiconductor substrate 12 and polycrystalline 26b atop the first shallow trench isolation regions 14. Preferably, but not necessarily always, the base layer 26 comprises SiGe. The thickness of the base layer 26 that is formed at this step of the present invention typically has a thickness after epitaxial growth of about 400 to about 6000 Å. It is noted that the base layer 26 is thicker atop the semiconductor substrate 12 than atop the first shallow trench isolation regions 14.

After forming the base layer 26, a base cap 28 comprised of a Si-containing material can optionally be formed atop the monocrystalline region 26a of base layer 26. The base cap 28 is typically present when the base layer 26 comprises SiGe. When present, the base cap 28 is formed utilizing the low-temperature epitaxial growth process mentioned above. The base cap 28 typically has a thickness from about 5 to about 15 nm.

After forming the structure shown in FIG. 5, a dielectric stack 30 comprising an oxide layer 32 and an nitride layer 34 is formed utilizing a conventional deposition process comprising, for example, CVD, PECVD, PVD, evaporation, chemical solution deposition and other like deposition processes. The structure including the dielectric stack 30 is shown, for example, in FIG. 6. The oxide layer 32 of the dielectric stack 30 has a thickness that is generally less than that of the overlying nitride layer 34. Typically, the oxide layer 32 has a thickness from about 10 to about 20 nm, while the nitride layer 34 has a thickness from about 100 to about 200 nm.

After forming the dielectric stack 30, a second patterned photoresist 36 is formed atop the surface of the nitride layer 34 providing the structure that is shown in FIG. 7. As shown, the second patterned photoresist 36 serves as a mask protecting portions of the dielectric stack 30 and the underlying base layer 26 in the active area 16. The second patterned photoresist 36 is formed utilizing lithography as described above.

A dry etching process that is selective in removing nitride as compared with oxide such as reactive ion etching is then performed with the patterned photoresist 36 atop the dielectric stack 30 to provide a patterned nitride layer 34'. The second photoresist 30 is removed after the etching process utilizing a conventional resist stripping process and thereafter the exposed portions of the oxide layer 32 not protected by the patterned nitride layer 34' are removed utilizing an etching process that is selective in removing oxide. For example, a buffered HF etch may be used. A patterned oxide 32' is formed. These steps of the present invention provide the structure which is shown in FIG. 8. Specifically, these steps provide a patterned dielectric stack 30' atop the active area 16.

A reactive ion etching process that is selective in removing semiconductor material is then performed on the structure shown in FIG. 8. This reactive ion etching step removes exposed portions of the base layer 26 not protected by the patterned dielectric stack 30'. Note that this etching step is stopped atop a surface of the buried region 18 by monitoring for the presence of dopants in the etchant stream. The resultant structure that is formed after this reactive ion etching step has been performed is shown in FIG. 9.

A spacer 38 is then formed on the exposed sidewalls of the patterned dielectric stack 30' and the etched surfaces of the base cap 28, the monocrystaline layer (herein after this monocrystaline portion is just labeled as 26) and an upper portion of substrate 12. The spacer 38, which is comprised of an oxide, nitride or combinations and multilayers thereof, is formed by deposition and etching. The spacer 38 is employed in the present invention to protect the base layer 26 during the subsequent undercut step. The resultant structure including spacer 38 is shown in FIG. 10.

FIG. 11 shows the structure that is formed after undercutting a portion of the semiconductor substrate 12 that lies beneath the patterned dielectric stack 30'. The undercutting is performed by laterally removing a portion of the buried region 18 that was previously formed into the semiconductor substrate 12. Any combination of reactive ion etching and wet etching can be used in forming the undercut region. The undercut region, which is labeled as reference numeral 40 in FIG. 11, serves as the trench for forming the second shallow trench isolation region. Since the second trench isolation region will be in contact with the first shallow trench isolation region 14, it may be referred to as an extension of the first shallow trench isolation region 14.

In accordance with the present application, the undercut region 40 has an inner sidewall surface 45 beneath the monocrystalline portion of base layer 26, that is sloped, i.e., tapered. The sloped sidewall is a direct result of the graded dopant profile present in the buried region 18. The sloped sidewall has an angle α measured from the upper surface of the undercut region to the sloped sidewall that is less than 90°, typically less than 70°.

The benefit of having shallow trench isolation regions with such sloped sidewalls is that this geometry provides maximum Ccb close to the collector-base junction, yet keeps the collector region wide. A wide collector helps to keep the collector resistance low.

It is further noted that in the present invention a layer of the semiconductor substrate is maintained beneath the base region. The maintained layer of the semiconductor substrate serves as a diffusion region for the raised extrinsic base and helps to link the base and extrinsic base together.

Figure 13:
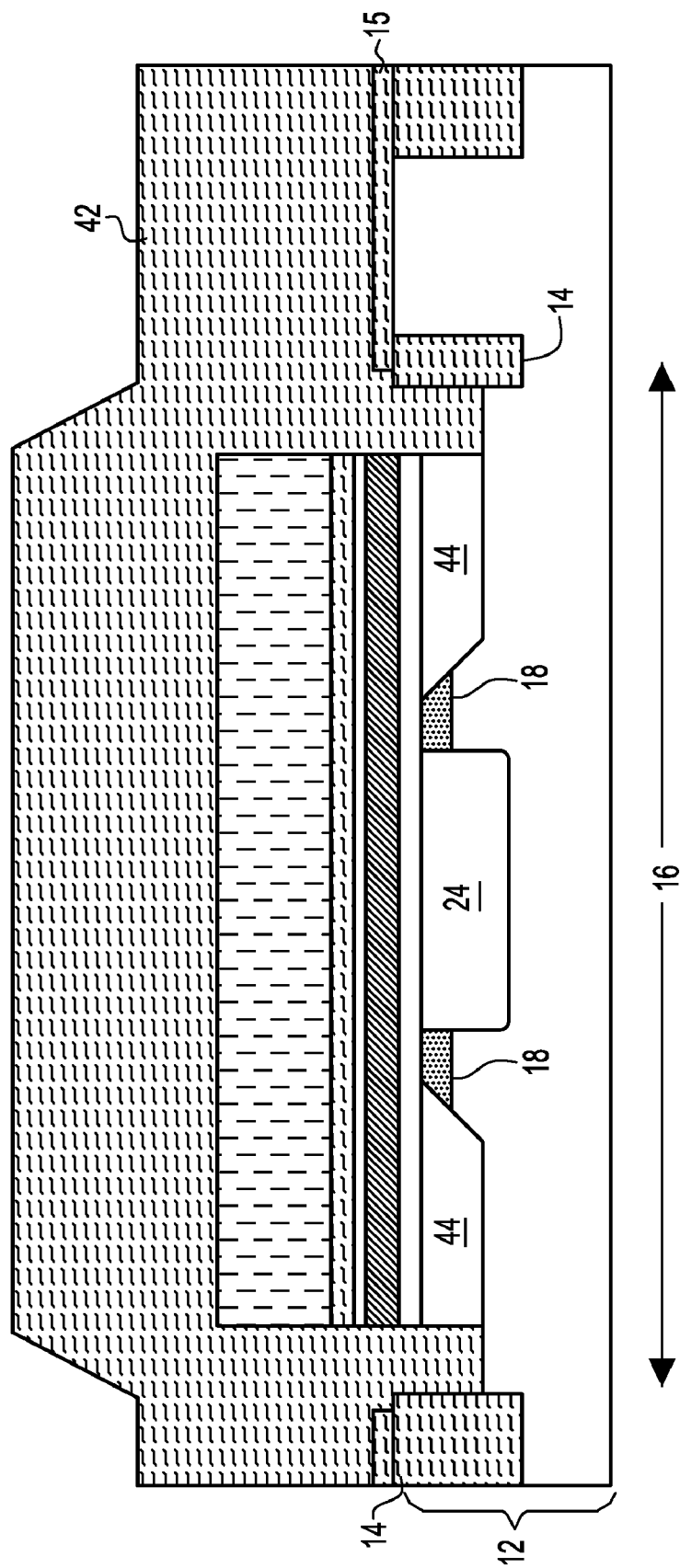

FIG. 12 shows one embodiment of the present invention, while FIG. 13 shows another embodiment of the present invention. In the embodiment shown in FIG. 12, a conformal oxide deposition process is performed completely filling the undercut region 40 with oxide 42. As shown, the oxide 42 extends above the surface of the semiconductor substrate 12 as well as above the patterned dielectric 30'. The oxide 42 employed in the present application has a low dielectric constant. In one embodiment, the oxide is a silicon oxide, which has a dielectric constant of only 33% of silicon. The oxide 42 within the undercut region 40 which remains after further processing steps of the present invention serves as the second shallow trench isolation region.

In the embodiment depicted in FIG. 13, a non-conformal oxide deposition process is performed which only partially fills the undercut region 40 with oxide 42. The unfilled portion of the undercut region is a void (or a vacuum) 44. The void 44 has a lower dielectric constant than the oxide 42. The void 44 together with the remaining oxide 42 not removed during subsequent processing steps of the present application serves as the second shallow trench isolation region in this particular embodiment of the invention.

A planarization process such as chemical mechanical polishing and a recess etching step such as reactive ion etching are then performed on the structure shown in FIGS. 12 and 13.

FIG. 14 shows the structure that is formed after performing the planarization and recess etching steps to the structure shown in FIG. 12. It is noted that although the undercut region 40 is shown as completely filled with oxide, it is possible to have a similar structure as shown in FIG. 14 wherein the undercut region includes void 44 and oxide 42.

FIG. 15 shows the structure that is formed after removing the patterned nitride layer 34' from the structure shown in FIG. 14. The removal of the patterned nitride layer 34' is performed by utilizing a stripping process that selectively removes nitride. For example, a hot phosphoric acid etching process can be used to remove the patterned nitride 36' from the structure.

Figure 16:
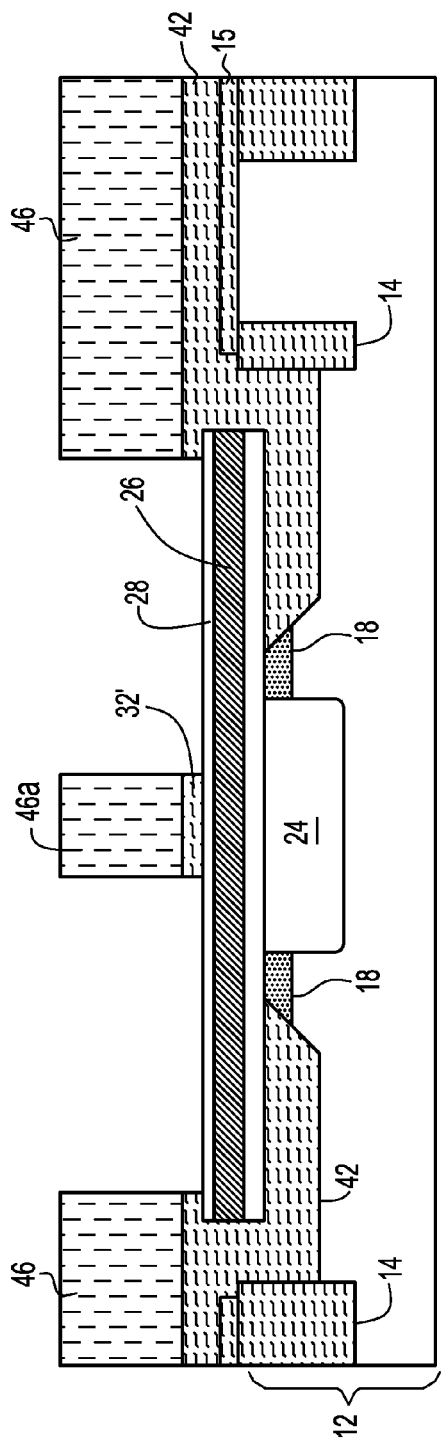
Figure 17:
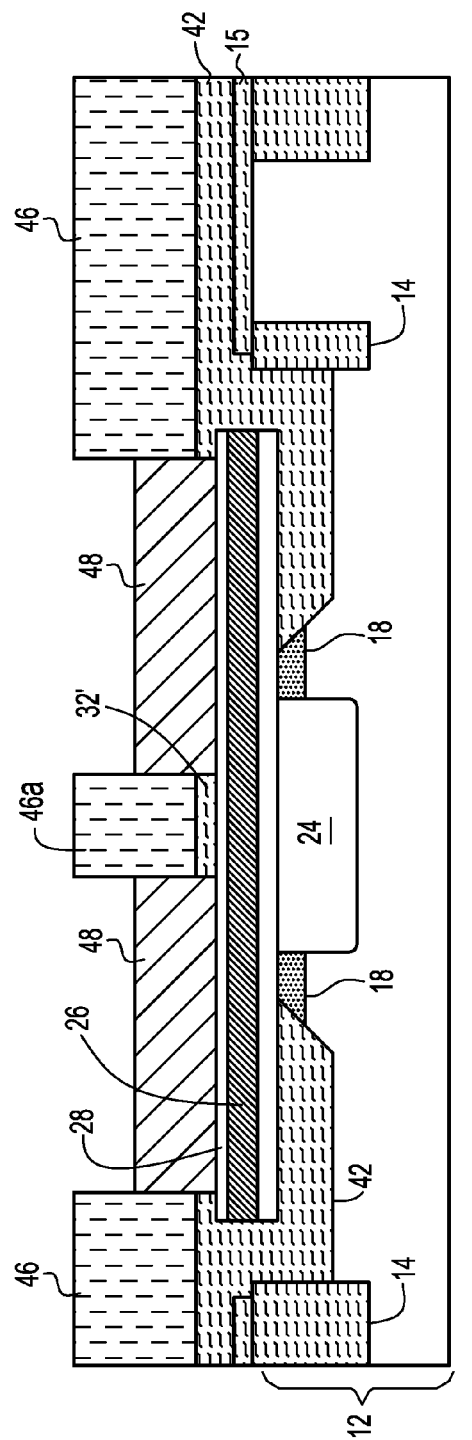

Another patterned nitride layer 46 is then formed on the structure shown in FIG. 15 providing the structure shown in FIG. 16. As is illustrated, a portion of the patterned nitride layer 46, e.g., the emitter mandrel 46a, is used in defining the raised extrinsic base region, while the remaining patterned nitride layer 46 is referred to as the field nitride. An oxide strip is then performed to remove the exposed patterned oxide layer 34' not protected by the emitter mandrel 46a. The emitter mandrel 46a is formed by deposition, lithography and etching.

The raised extrinsic base 48 is now formed on the structure shown in FIG. 16. In one embodiment of the present invention, the raised extrinsic base 48 is a polycrystalline semiconductor material that is formed by deposition, planarization and recessing. In another embodiment, the raised extrinsic base 48 is a crystalline semiconductor material that is formed by selective epitaxial growth. The raised extrinsic base 48 is comprised of a doped polycrystalline or crystalline semiconductor material including, for example, polySi, Si, SiGe or multilayers thereof. Preferably, but not necessarily always, the raised extrinsic base 48 is comprised of doped polySi. The deposition of the raised extrinsic base 48 may be performed utilizing a conventional deposition process such as, for example, CVD, PECVD, evaporation or PVD. The planarization step includes chemical mechanical polishing, grinding or a combination thereof, while the etching step typically includes a timed reactive ion etching process. Selective epitaxy is performed utilizing processes well known to those skilled in the art.

An isolation oxide 50 is then deposited, planarized and recessed providing the structure shown in FIG. 18. The deposition, planarization and recessing may include the same basic techniques as described above for forming the raised extrinsic base 48.

The patterned nitride 46 including the emitter mandrel 46a is then removed from the structure utilizing an etching process such as reactive ion etching or hot phosphoric acid etching that is selective in removing nitride. Nitride spacer 52 is then formed by deposition and etching providing the structure shown in FIG. 19. As shown, the nitride spacer 52 is located on sidewalls of the isolation oxide 50 and the raised extrinsic base 48.

FIG. 20 shows the structure that is formed after performing an oxide stripping process, and after emitter 54 and emitter cap 56 formation which is achieved by removing the exposed oxide not protected by the nitride spacer 52, deposition, lithography and etching. The removal of the oxide between portions of the raised extrinsic base provides an opening to the base layer. The emitter 54, which is formed within this opening and over the raised extrinsic base, is comprised of polySi, polySiGe or multilayers thereof. Typically, the emitter 54 is comprised of polySi. The emitter cap 56 is comprised of a nitride.

Next, an oxide stripping process is performed to remove excess oxide 42 and the patterned hard mask 15 from the structure. A nitride spacer 58 is then formed around the emitter region and silicide regions 60 are formed into the exposed semiconductor substrate 12 and the raised extrinsic base 48 by utilizing a conventional silicidation process. The silicidation process includes depositing a metal that is capable of reacting with silicon to form a silicide, annealing, removing any unreacted metal, and optionally performing a second anneal. The metal used in forming the silicide includes one of Ti, Co and Ni, with Co being typically preferred. These steps of the present application provide the structure shown in FIG. 1.

It is noted that during the oxide strip the oxide 42 that extends above the surface of the substrate 12 is removed defining the second shallow trench isolation region 42' of the inventive structure. The second shallow trench isolation regions 42 may be completely filled with oxide or a void may exist in the second trench isolation region 42'. The second shallow trench isolation region 42' is in direct contact with an edge of one of the first shallow trench isolation regions 14. Moreover, the second shallow trench isolation region 42' extends inward from the first shallow trench isolation region towards the collector 24. The second shallow trench isolation region 42' has an inner sidewall surface 45 that is sloped.

It is emphasized herein that in the present invention the second shallow trench isolation is formed after the growth of the collector and base. The process sequence provides a structure having a larger drop in Ccb than is the case with prior art processes discussed above. Moreover, this process sequence removes the intrinsic junction capacitance and the capacitance caused by the collector implant.

Figure 21:
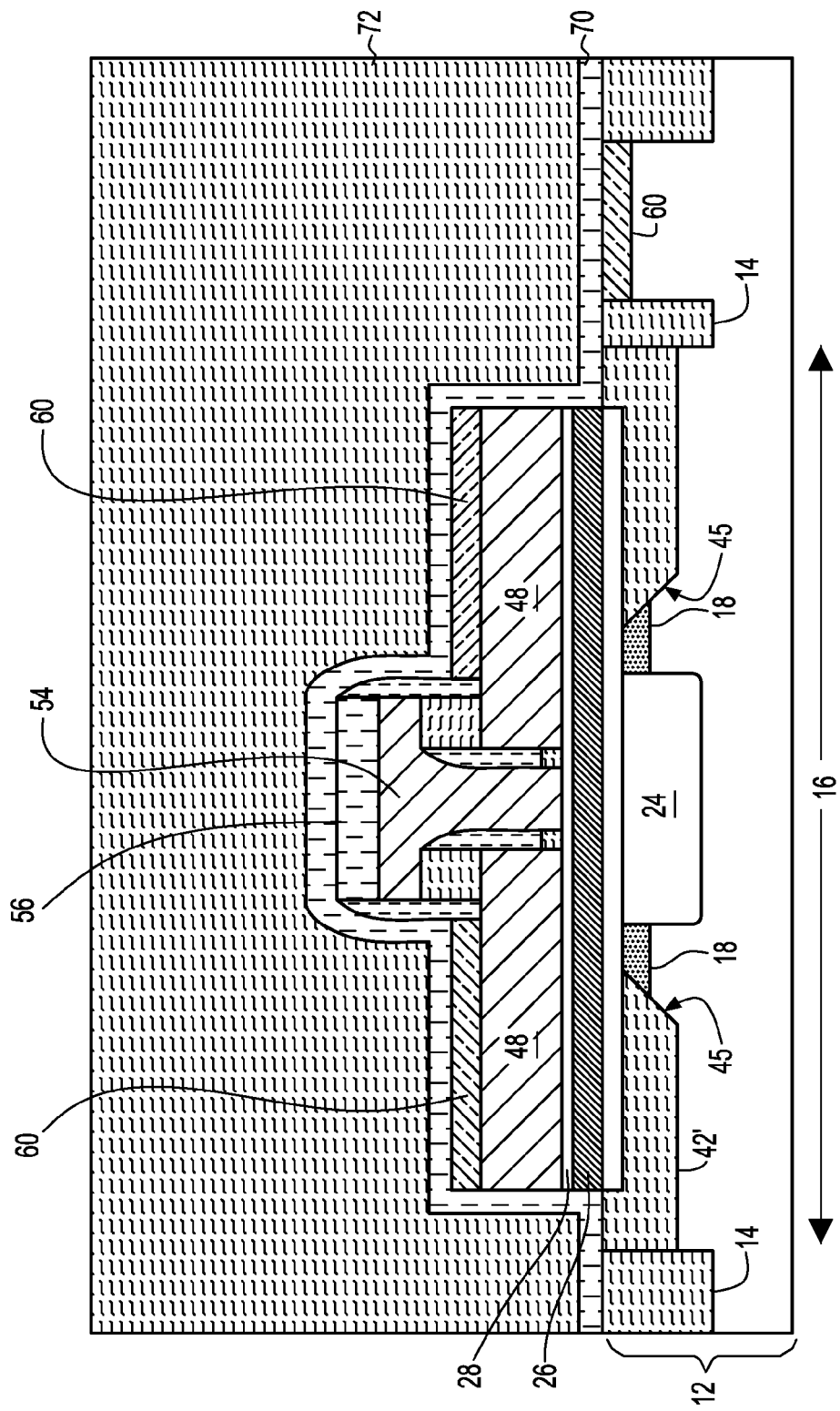

FIG. 21 shows an embodiment of the present invention wherein the structure shown in FIG. 1 is provided and the raised extrinsic base 48 is comprised of a crystalline semiconductor material. After forming the structure shown in FIG. 1 utilizing the basic processing steps described above in connection with FIGS. 1-20, a compressive or tensile stress material 70 and an intralevel dielectric 72 are formed over the structure shown in FIG. 1. The compressive or tensile stress material 70 is typically a nitride such as silicon nitride. The stress material 70 is formed by a conventional deposition process. It is noted that the stress material 70 introduces a strain to the raised extrinsic base 48 provided strained raised extrinsic base 48'. The strained raised extrinsic base 48' has increased mobility of carriers than a non-strained raised extrinsic base. The increased mobility is observed for strained crystalline semiconductors, while little of no increase mobility is seen with polycrystalline semiconductor materials. The intralevel dielectric 72 is comprised of a conventional dielectric such as $SiO_2$, silicate glass, etc.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    a semiconductor substrate having at least a pair of first neighboring shallow trench isolation (STI) regions disposed therein, said pair of first neighboring STI regions defining an active area in said substrate;
    a collector disposed in a buried region in said active region of said substrate, said buried region having a graded profile of dopants;
    a base layer disposed atop a surface of said semiconductor substrate in said active area;
    a raised extrinsic base disposed on said base layer, said raised extrinsic base having an opening to a portion of said base layer;
    an emitter located in said opening and extending over a portion of said raised extrinsic base, said emitter is spaced apart and isolated from the raised extrinsic base, wherein a lower surface of the emitter is coplanar with an entire lower surface of the raised extrinsic base, and wherein the entire lower surface of the raised extrinsic base is planar; and
    a second shallow trench isolation (STI) region in said semiconductor substrate extending inward from a sidewall of each first shallow trench isolation (STI) region of the pair of said neighboring first (STI) regions, the second STI region present adjacent to each of the pair of the first neighboring STI regions and extending inwards towards said collector, wherein said second STI region does not overlie an upper surface of each of the pair of the first neighboring STI regions, and the second STI region has an inner sidewall surface in proximity to the collector that is sloped and underlying the base layer, wherein a planar surface portion of the second shallow trench isolation region is coplanar with an upper surface of the collector, and wherein said planar surface portion of the second shallow trench isolation region is parallel with a lower surface of the base layer and extends from the inner sidewall surface that is sloped towards the first trench isolation region.

2. The semiconductor structure of claim 1 wherein said second STI region is completely filled with an oxide.

3. The semiconductor structure of claim 1 wherein said second STI region is partially filled with an oxide and partially contains a void, said void is located adjacent said inner sidewall surface, wherein the inner sidewall surface is tapered.

4. The semiconductor structure of claim 1 wherein said second STI region is located beneath said base layer with a semiconducting layer located there between.

5. The semiconductor structure of claim 1 wherein said second STI region is located under the entire area of the raised extrinsic base.

6. The semiconductor structure of claim 1 wherein said base layer comprises Si, SiGe and a combination thereof.

7. The semiconductor structure of claim 1 wherein said raised extrinsic base comprises a polycrystalline semiconductor material.

8. The semiconductor structure of claim 1 wherein said raised extrinsic base comprises a crystalline semiconductor material.

9. The semiconductor structure of claim 8 further comprising a compressive or tensile stressed material on said semiconductor structure to increase the mobility of carrier within said crystalline semiconductor material.

10. The semiconductor structure of claim 1 further comprising silicide regions located within said raised extrinsic base and a surface portion of said semiconductor substrate.

11. The semiconductor structure of claim 1 wherein said base layer in said active area is completely monocrystalline.

12. The semiconductor structure of claim 1 wherein the raised extrinsic base is separated from the planar portion of the second shallow trench isolation region that is coplanar with the upper surface of the collector by the base layer.

13. A semiconductor structure comprising:
    a semiconductor substrate having at least a pair of neighboring first shallow trench isolation (STI) regions disposed therein, said pair of neighboring first STI regions defining an active area in said substrate;
    a collector disposed in a buried region in said active region of said substrate, said buried region having a graded profile of dopants;
    a completely monocrystalline base layer disposed atop a surface of said semiconductor substrate in said active area;
    a raised extrinsic base disposed on said base layer, said raised extrinsic base having an opening to a portion of said base layer;
    an emitter located in said opening and extending over a portion of said raised extrinsic base, said emitter is spaced apart and isolated from the raised extrinsic base, wherein a lower surface of the emitter is coplanar with an entire lower surface of the raised extrinsic base, and wherein the entire lower surface of the raised extrinsic base is planar; and
    a second shallow trench isolation (STI) region in said semiconductor substrate extending inward from a sidewall of each first shallow trench isolation (STI) region of the pair of said neighboring first STI regions, the second STI region present adjacent to each of the pair of the first STI regions and extending inwards towards said collector, wherein said second STI region does not overlie an upper surface of each of the pair of the first STI regions, and the second STI region has an inner sidewall surface in proximity to the collector that is sloped and underlying the base layer, wherein a planar surface portion of the second shallow trench isolation region is coplanar with an upper surface of the collector, and wherein said planar surface portion of the second shallow trench isolation region is parallel with a lower surface of the completely monocrystalline base layer and extends from the inner sidewall surface that is sloped towards the first trench region.

14. The semiconductor structure of claim 13 wherein said second STI region is completely filled with an oxide.

15. The semiconductor structure of claim 13 wherein said second STI region is partially filled with an oxide and partially contains a void, said void is located adjacent said inner sidewall surface, wherein the inner sidewall surface is tapered.

16. The semiconductor structure of claim 13 wherein said second STI region is located beneath said base layer with a semiconducting layer located there between.

17. The semiconductor structure of claim 13 wherein said second STI region is located under the entire area of the raised extrinsic base.

18. The semiconductor structure of claim 13 wherein said base layer comprises Si, SiGe and a combination thereof.

19. The semiconductor structure of claim 13 wherein said raised extrinsic base comprises a crystalline semiconductor material.

20. The semiconductor structure of claim 19 further comprising a compressive or tensile stressed material on said semiconductor structure to increase the mobility of carrier within said crystalline semiconductor material.

21. The semiconductor structure of claim 13 further comprising silicide regions located within said raised extrinsic base and a surface portion of said semiconductor substrate.

22. The semiconductor structure of claim 13 wherein the raised extrinsic base is separated from the planar portion of the second shallow trench isolation region that is coplanar with the upper surface of the collector by the completely monocrystalline base layer.

* * * * *